United States Patent [19]

Berger et al.

[11] 3,938,071

[45] Feb. 10, 1976

[54] GENERATOR FOR CONTROLLING AN ULTRASONIC TRANSDUCER

[75] Inventors: Roger Berger, Manosque; Claude Estienne, Marseille; Jean Lapie, Volx, all of France

[73] Assignee: Commissariat a l'Energie Atomique, Paris, France

[22] Filed: June 5, 1974

[21] Appl. No.: 476,576

[30] Foreign Application Priority Data

June 13, 1973 France .............................. 73.21519

[52] U.S. Cl. .................... 340/15; 340/3 A; 328/22; 328/27; 307/261
[51] Int. Cl.² ......................................... H04B 11/00
[58] Field of Search ............ 328/21, 22, 27; 340/15, 340/3 A; 307/261

[56] References Cited
UNITED STATES PATENTS

| 2,735,014 | 2/1956 | Rado ..................................... 328/27 |
| 2,983,872 | 5/1961 | Williamson et al. ................... 328/27 |
| 3,078,416 | 2/1963 | McAuliffe ............................. 328/22 |
| 3,182,489 | 5/1965 | Hamilton .............................. 340/15 |
| 3,201,707 | 8/1965 | Aucremanne et al. ................ 328/27 |
| 3,342,283 | 9/1967 | Pound ................................. 340/3 A |
| 3,579,117 | 5/1971 | Norris et al. .......................... 328/27 |

OTHER PUBLICATIONS

O. H. McDaniel et al., Method For The Reduction Of The Harmonic Content of High–Intensity Acoustic Pulses, J. Acoust. Soc. Am., Vol. 38, No. 6, Dec. 1965 pp. 1062–1063.

*Primary Examiner*—Maynard R. Wilbur
*Assistant Examiner*—T. M. Blum
*Attorney, Agent, or Firm*—McNenny, Farrington, Pearne & Gordon

[57] ABSTRACT

A generator for controlling a transducer by means of sinusoidal wave trains is constituted by the association in series of a generator for producing wave trains formed by a whole number of half-cycles of periodic signals and of a filter which is tuned to the frequency of the periodic signals.

5 Claims, 9 Drawing Figures

GENERATOR FOR CONTROLLING AN ULTRASONIC TRANSDUCER

This invention relates to a generator for controlling a transducer by means of sinusoidal wave trains.

This device is particularly useful for pulsing the transducer of an ultrasonic emitter. In order to produce sinusoidal wave trains in ultrasonic systems, it had in fact been the practice up to the present time to make use of a continuously-operating sinusoidal wave generator followed by an analog gate (equivalent to a switch) which was opened during the time required for driving the transducer with the analog gate. This chopped sine-wave signal then drove the transducer after passing through a power amplifier. This produced a signal/noise ratio or rather a ratio of signal during the emission to signal outside the emission of the order of 500, the noise being caused by radiation of the generator, galvanic couplings and especially stray interelectrode capacitances of the transistors. If consideration is given by way of example to an experiment involving detection of echos which follow the ultrasonic emission, it is essential to ensure that this signal-to-noise ratio is excellent.

A further defect of the analog gate device is the non-synchronization in phase of the beginning of the ultrasonic emission and of the activation of the analog gate. One method of overcoming this disadvantage is to initiate the activation by division of the ultrasonic frequency (submultiple of the emission frequency). This practice, however, lacks flexibility since only particular values of the recurrence frequency can be obtained.

The two disadvantages which are in some cases prohibitive and are attached to the analog gate associated with a continuously-operating oscillator, namely a low ratio of emission signal to out-of-emission signal and lack of synchronization are the predominant defects of the prior art which have led to the elaboration of the present invention.

This invention consists in making provision for a control generator in which an emitter-oscillator is caused to oscillate only during the period of emission of the wave train, the emitter-oscillator being blocked outside the emission period. To this end, the oscillator is constructed with a generator for producing any periodic signals of given frequency and amplitude such as rectangular-wave signals, for example, followed in series by an active filter which permits the passage only of the fundamental component of the signal emitted by the generator. In other words, the control generator is constituted by the association in series of a generator for producing wave trains formed by a whole number of half-cycles of periodic signals and of a filter which is tuned to the frequency of said periodic signals.

Since it is a matter of difficulty to control a sine-wave generator directly without an extremely complicated circuit arrangement, a stable rectangular-wave generator is employed in accordance with the invention and the signal emitted by the generator is subjected to a strong filtering action. The distortion factor with respect to a pure sine-wave is not a consideration of key importance in many applications such as echo detection, the main criterion being that of amplifier noise outside the instants of emission and the character of such noise.

It is important to note, however, that the applications of the present invention are not limited to driving of ultrasonic transducers but extend to all applications in which the two criteria mentioned above must be satisfied.

In one embodiment of the invention, the rectangular voltage signal is obtained by generating two rectangular signals A and B which are symmetrical with respect to the zero voltage point, these two signals being added in an adding circuit so as to obtain a symmetrical alternating rectangular wave.

The invention consists of a generator comprising means for producing periodic signals of given frequency and amplitude, means for filtering the signal and permitting the passage of only the fundamental component, and a control for opening and closing of the generator which determines the time-duration of the emission.

The generator comprises a relaxation circuit having at least one stable state and control means for delivering turning-on and turning-off orders to said relaxation circuit. The relaxation circuit is advantageously a bistable circuit.

In one embodiment of the invention, recurrent rectangular functions of given frequency and amplitude are generated by means of oscillators having two monostable devices in closed integrated circuits in which the two output signals are added; the means for filtering the recurrent rectangular signal by allowing only the fundamental component to pass are low-pass filters of the second order having an adjustable damping coefficient in which the amplifying stage is a modular operational amplifier and the opening and closing control is a square-wave voltage on one of the gates of a monostable device of the periodic rectangular-signal generator.

The idea of controlling an oscillator directly in order that there should no longer be any signal outside the emission period does not readily lead to a practical design in the case of a sinusoidal oscillator since it is not possible to have short cut-offs in this case inasmuch as the current rises and falls are exponential. On the other hand, it is very easy to control a rectangular-wave generator by means of a logical pulse but it is then necessary to filter in order to make this signal sinusoidal; a difficulty then arises in the low-pass filter. This difficulty is overcome by the use of an active filter comprising an integrating amplifier having a gain which varies with the frequency on account of a reaction circuit which is also dependent on this latter; the filter has a resonant frequency which is so adjusted as to be equal to the frequency of the first harmonic of the input signal.

In accordance with the invention, there is obtained a sinusoidal wave train having a distortion factor of less than 1 % and the noise outside the instant of emission is "pseudo-white" (in all cases, when the oscillator is blocked, there are not any components at the frequency of the rectangular-wave generator); thus the ratio of emission signal to out-of-emission signal is practically infinite. Furthermore, the phase of the beginning of the oscillation is fixed in the case of all the wave trains.

A better understanding of the invention will in any case be gained from the following description of one embodiment of the invention which is given without implied limitation, reference being made to the accompanying drawings, in which:

FIG. 1 is a diagram of operation of the device in accordance with the invention as applied to the production of ultrasonic waves;

3

Figure 1:
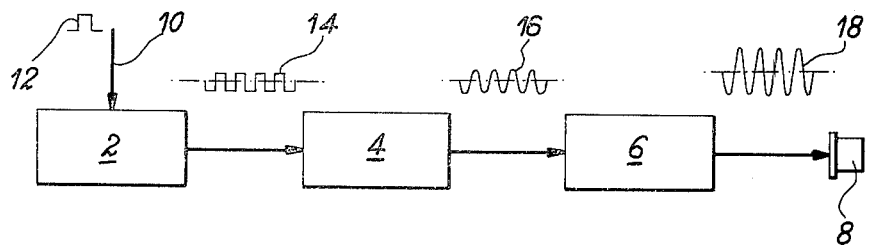

In the flow diagram of the invention which is represented in FIG. 1, the rectangular-wave generator designated by the reference numeral 2 is followed by a low-pass filter 4, then by a power amplifier 6 which drives a transducer formed by a piezoelectric crystal 8; triggering of the rectangular-wave generator 2 is initiated at 10 by the activating electric signal 12 so as to produce at 14 a train of rectangular-wave pulses which are filtered in the filter 4 so as to produce the train 16 of sine-waves, the amplitude of which is magnified by the power amplifier 6 so as to produce the wave train 18 for driving the transducer.

Figure 2:
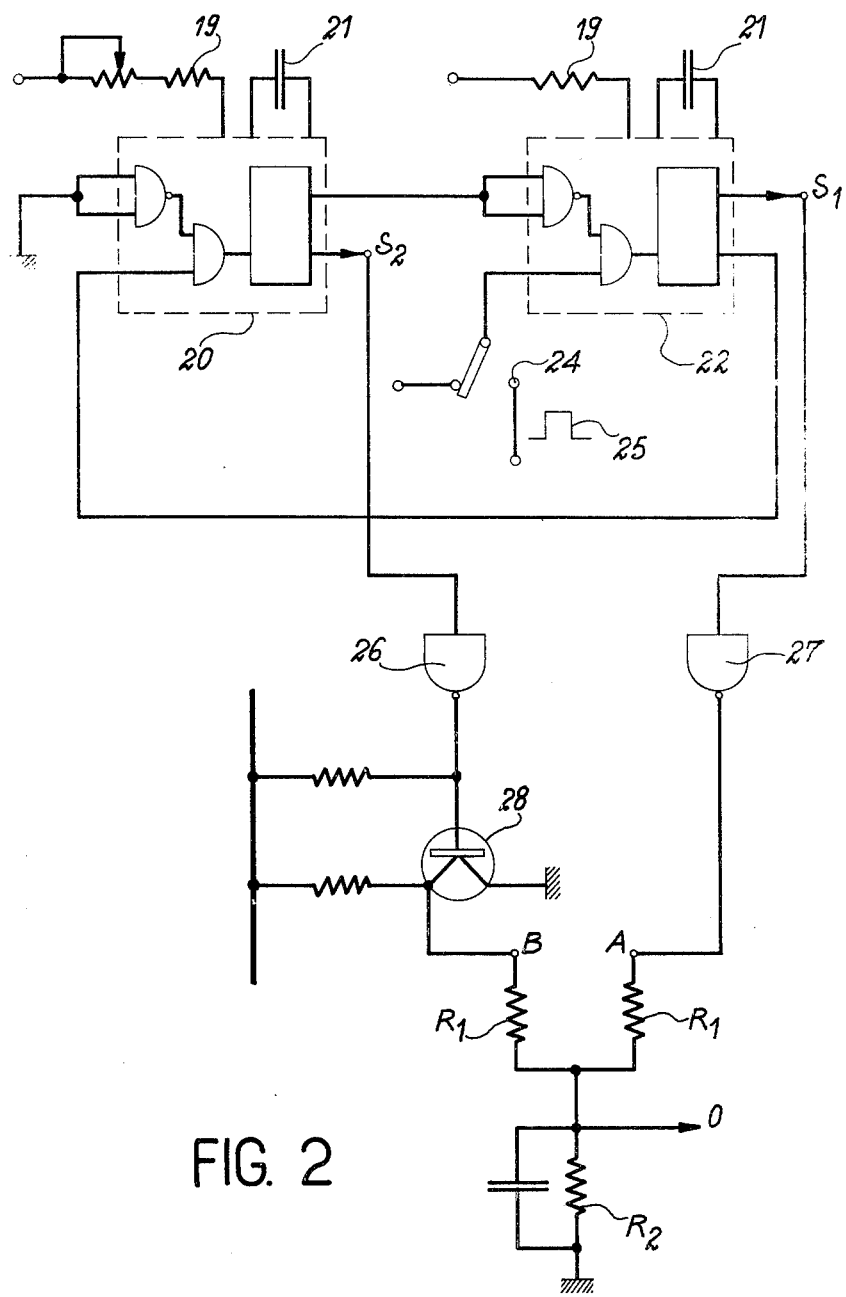
FIG. 2 shows one example of construction of the rectangular-signal generator which is formed by two mono-stable multivibrators.

There is shown in FIG. 2 a rectangular-signal emitter constituted by two monostable multivibrators 20 and 22 in integrated loop circuits. The two outputs $S_1$ and $S_2$ are rectangular waves at a predetermined frequency (of the order of a few Mc/s) and synchronous. The frequency is adjustable by varying the time of transition of the two monostable multivibrators by means of resistors 19 and capacitors 21. In one example of utilization, the resistors 19 have a value of a few kilohms and the capacitors C have a value of 40 pF, which corresponds to frequencies of the order of 1 Mc/s. A pulsed D.C. inverter 24 which constitutes the activating and deactivating control permits transition from the position of continuous oscillation for adjusting the frequency of the oscillator to the utilization position of pulsed oscillation. The turning-on control waveform is shown at 25. A circuit constituted by two NOT-AND inverters 26 and 27 and by a transistor 28 makes it possible to produce by means of displaced signals $S_1$ and $S_2$ two signals which are symmetrical with respect to zero and designated in the figure as A and B. These two signals A and B are summated in a resistor adder in which $R_1$ = 1 kilohm and $R_2$ = 10 kilohms, for example. A symmetrical alternating square wave as designated by the letter O is obtained at the output and is subsequently filtered.

Figure 3:
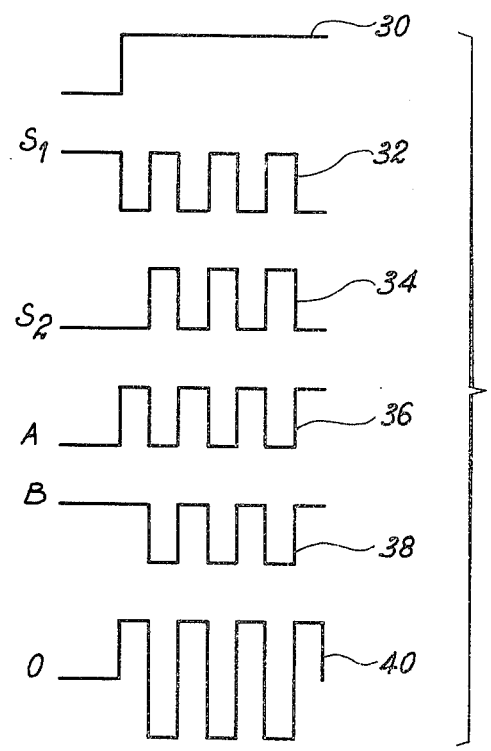
FIG. 3 shows the waveform of the currents obtained at different points of the rectangular-signal generator.

FIG. 3 represents the amplitude of the electrical signals as a function of time: the beginning of the turning-on control is represented at 30, the signal $S_1$ is represented at 32, the signal $S_2$ at 34, the signal A at 36, the signal B at 38 and finally the output signal O at 40.

The wave O which will be filtered has a development in a Fourier series of the form:

$$O(t) = 2O_o \sum_{n=o}^{\infty} \frac{1}{(2n+1)\pi} \sin(2n+1)\omega t$$

4 where $O_o$ is the maximum amplitude of the signal $O(t)$ generated as shown at 40 and $\omega$ is the fundamental angular frequency. There only exist odd harmonics, the mean value of which is 0. If filtering is carried out, we form n = O and we have a filtered function $O'(t)$:

$$O'(t) = \frac{2 O_o}{\pi} \sin \omega t.$$

The wave train is rapidly initiated in less than 20 nanoseconds in the case of the transistors employed. Chopping is performed within one cycle.

The characteristics of this example of construction in accordance with the invention are set forth hereunder:
  the shortest time-duration of emission is one half-wave of the ultrasonic signal;
  the longest time-duration is the period of recurrence of the turning-on control less one period of the signal of the rectangular-wave generator;
  in the example of construction which has been developed, the period of recurrence of this circuit was capable of varying between 3.6 c/s and 500 kc/s;
  the emission frequency can range from a few c/s to a frequency which is higher than 5 Mc/s. The change of frequency is carried out by means of a resistor-type potentiometer and a change of capacitance in the monostable circuits.

Figure 4:
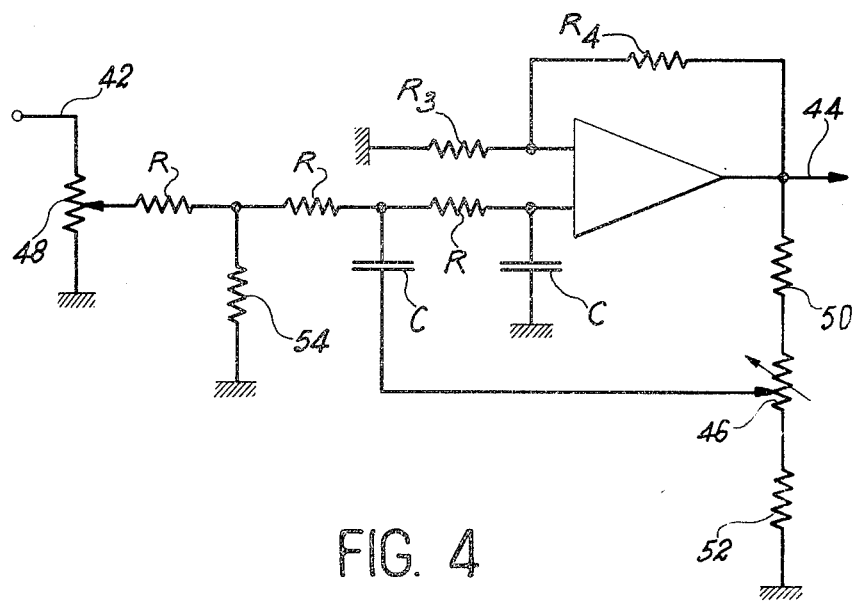
FIG. 4 shows one form of construction of a low-pass filter by means of an operational amplifier.
Figure 5A:
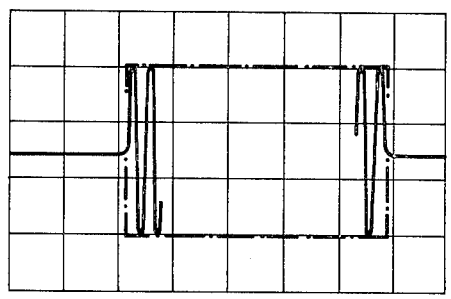
FIG. 5a shows the appearance of the rectangular-pulse wave train emitted by the generator.
Figure 5B:
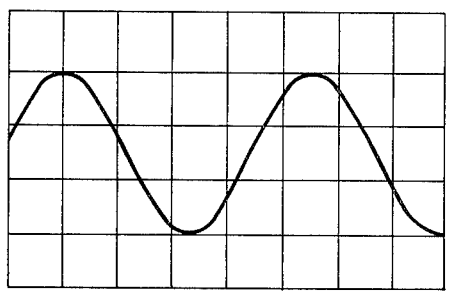
FIG. 5b shows the sine-wave which appears after passing through the filter.
Figure 5C:
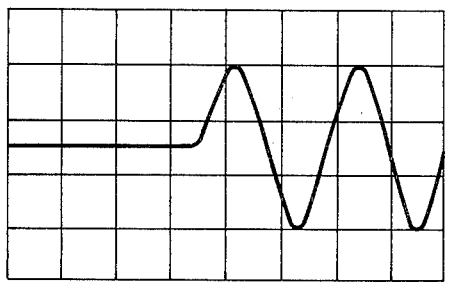
FIG. 5c shows the appearance of the initial portion of the sine-wave produced by triggering of the generator
Figure 5D:
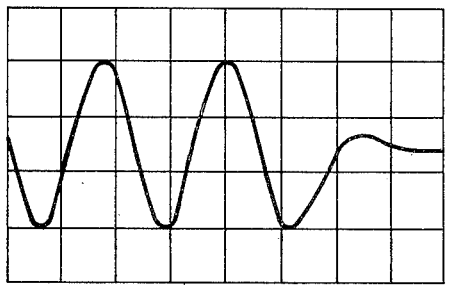
FIG. 5d shows the shape of the cut-off of the sine-wave emission, said cut-off being produced by closing the generator.

There is shown diagrammatically in FIG. 4 a first form of construction of the filter of the second order having an adjustable damping coefficient. The signal which enters at 42 is filtered and passes out at 44. The resistors R have a value of 6.8 kilohms, the capacitors C have a value of 4.7 pF, the resistor at 50 and 52 have a value of 1 kilohm, the resistors at 54 has a value of 10 kilohms, the potentiometers at 46 and 48 are adjustable from 0 to 10 kilohms, the resistor $R_4$ has a value of twice the resistor $R_3$ which in turn has the value of 1 kilohm. In this case, the transfer function W of a filter of this type is given by:

$$W_{(p)} = \frac{3}{R^2C^2p^2 + ARCp + 1}$$

where $p = j\omega$ in a sine-wave with A = 1.5 (1−B), B being the potentiometric ratio of the feedback loop. The modular operational amplifier which is employed has a gain of 100,000 in an open loop and a pass-band of 20 Mc/s with a gain of unity. The wave train obtained at the output of the filter at 44 is represented in FIG. 5a in which the scale of ordinates is 5 V/cm, the scale of abscissae is 5 µs/cm: the wave train has a stable amplitude and sharp cut-offs. In the case of another time scale of 100 nanoseconds per centimeter and a scale in ordinates of 2 V/cm, the sine-wave obtained in FIG. 5b which represents the signal at the output of the filter has low distortion. The initial portion of the sine-wave represented in FIG. 5c with a time scale of 200 ns/cm is good and the same applies to the cut-off signal shown in FIG. 5d with the same scales, the scale in ordinates being 2 V/cm in FIGS. 5c and 5d.

Figure 6:
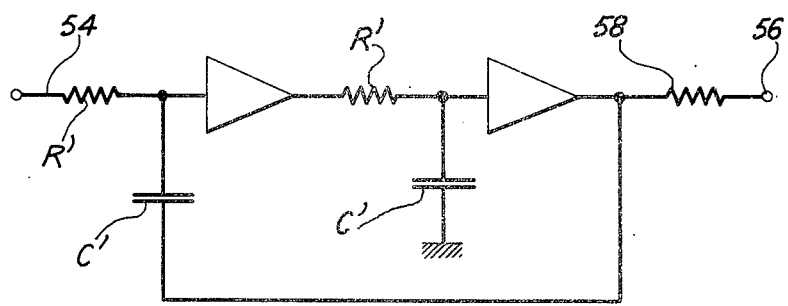
FIG. 6 shows another form of construction of the low-pass filter with separating amplifiers.

There is shown in FIG. 6 a second embodiment of the invention which consists of two amplifiers of the separating type which form a low-pass filter of lower cost than the operational amplifier shown in FIG. 4. These separating amplifiers have a uniform gain of 1 within the 0 – 30 Mc/s band with an input impedance of 200 kilohms and an output impedance of 6 ohms. Said amplifiers must be protected from short-circuits at the output 56 by means of a resistor 58 having a value of 50 ohms. The input is at 54. The resistors R' both have values of 1 kilohm whilst the capacitors C' have a value of 39 pF. The output voltage range can have a maximum peak-to-peak value of 5 volts in the case of these two amplifiers which can be mounted on the same plate as the blocked oscillator.

The invention is clearly not limited to the particular embodiments described by way of example and illustrated in the drawings. It must be understood that the scope of this patent extends to alternative forms of construction which come within the definition of equivalent means, particularly in regard to the regularization of the blocked oscillator, the character of the periodic signals which could be triangular signals, for example, as well as equivalent forms of construction of the active low-pass filter.

What we claim is:

1. In combination, an ultrasonic transducer and a device for controlling said ultrasonic transducer; said device comprising control means having an output, said control means output providing a control signal of predetermined frequency, an oscillator, said control means being electrically connected to said oscillator to activate and deactivate said oscillator, said oscillator having an output emitting a rectangular full-wave periodic signal of predetermined oscillating frequency and predetermined amplitude, said oscillator being constructed and arranged such that the duration of said periodic signal is dependent upon said activating and deactivating of said oscillator by said control signal and such that said oscillator only oscillates during the time period between said activating and deactivating, said control signal being synchronous with said periodic signal, said predetermined oscillating frequency of said oscillator periodic signal being wholly independent of said predetermined frequency of said control signal, filter means electrically connected to said oscillator output for filtering said rectangular full-wave periodic signal, said filter means output being constructed and arranged to emit a sinusoidal signal consisting of the fundamental component of said rectangular full-wave periodic signal; and said ultrasonic transducer having an input electrically connected to said filter means output to receive said sinusoidal signal emitted by said filter means output.

2. The combination defined in claim 1 wherein said oscillator includes at least one bistable circuit to deliver square wave form signals.

3. The combination defined in claim 2 wherein an amplifier is electrically connected between said filter means output and said ultrasonic transducer.

4. The combination defined in claim 3 wherein said filter means is active.

5. In combination, an ultrasonic transducer and a device for controlling said ultrasonic transducer; said device comprising control means having an output, said control means output providing a control signal, said control signal being a pulse train of predetermined frequency, a pulse thereof being rectangular and of predetermined duration and constant amplitude, said control means being electrically connected to an oscillator to activate and deactivate said oscillator, said oscillator having an output emitting a rectangular full-wave periodic signal of predetermined oscillating frequency and predetermined amplitude, said oscillator being constructed and arranged such that the duration of said periodic signal is dependent upon said activating and deactivating of said oscillator by said control signal and such that said oscillator only oscillates during the duration of said control pulse, said control signal being synchronous with said periodic signal, said predetermined oscillating frequency of said oscillator periodic signal being wholly independent of said predetermined frequency of said control signal train, said oscillator including first and second monostable multivibrators electrically connected in a closed integrated loop circuit to generate two separate rectangular half-wave signals, said monostable multivibrators being constructed and arranged such that an output of said first monostable multivibrator is electrically connected to an input of said second monostable multivibrator and an output of said second monostable multivibrator is electrically connected to an input of said first monostable multivibrator, said control means output being electrically connected to only one of said monostable multivibrators, said oscillator further including two inverters for inverting said rectangular half-wave signals and a resistor adder for summing said inverted rectangular half-wave signals to form said rectangular full-wave periodic signal, filter means having an output, said filter means being electrically connected to said oscillator output for filtering said rectangular full-wave periodic signal to emit a sinusoidal signal consisting of the fundamental component of said rectangular full-wave periodic signal at said filter means output, amplifier means having an output, said filter means being electrically connected to amplifier means, an ultrasonic transducer electrically connected to said amplifier means output, and said ultrasonic transducer emitting an ultrasonic signal only during the duration of said control pulse.

* * * * *